United States Patent [19]

Hickling

[11] 4,336,417
[45] Jun. 22, 1982

[54] COVER ASSEMBLIES FOR ELECTRICAL APPARATUS

[75] Inventor: David J. Hickling, Beeston, England

[73] Assignee: Plessey Handel und Investments AG, Zug, Switzerland

[21] Appl. No.: 166,328

[22] Filed: Jul. 7, 1980

[30] Foreign Application Priority Data

Jul. 10, 1979 [GB] United Kingdom ............... 7924065

[51] Int. Cl.³ .............................................. H05K 5/03
[52] U.S. Cl. .................................... 174/52 R; 361/400
[58] Field of Search .................. 174/50, 52 R, 138 G; 361/400, 403–411, 417–420; 339/37

[56] References Cited

U.S. PATENT DOCUMENTS

| 3,571,771 | 3/1971 | Stephanson | 174/52 R X |
| 3,950,603 | 4/1976 | Brefka | 174/52 R |
| 4,149,028 | 4/1979 | Gressitt | 174/52 R X |

FOREIGN PATENT DOCUMENTS

| 580693 | 9/1946 | United Kingdom . |
| 623505 | 5/1949 | United Kingdom . |
| 833222 | 4/1960 | United Kingdom . |
| 1094777 | 12/1967 | United Kingdom . |
| 1157067 | 7/1969 | United Kingdom . |
| 1243712 | 8/1971 | United Kingdom . |
| 1523260 | 8/1978 | United Kingdom . |

Primary Examiner—Arthur T. Grimley
Assistant Examiner—D. A. Tone
Attorney, Agent, or Firm—Fleit & Jacobson

[57] ABSTRACT

A non removable cover for an electrical device e.g. a cradle switch springset in a telephone comprises a cover which slides on to the electrical device and a mounting pad which holds the cover in position when the electrical device is soldered onto a printed wiring board.

5 Claims, 4 Drawing Figures

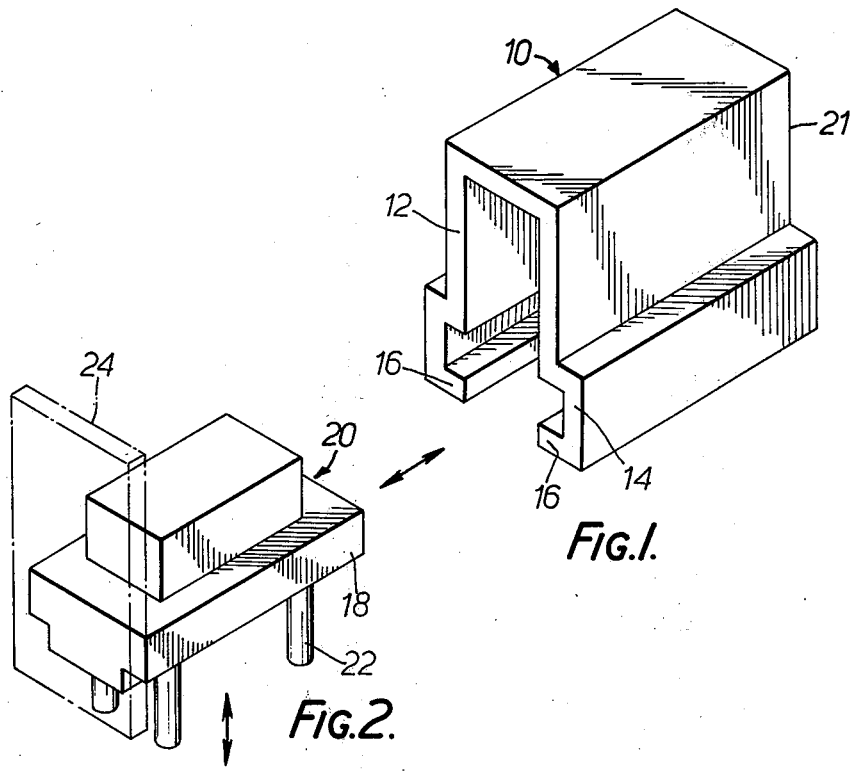
Fig.1.
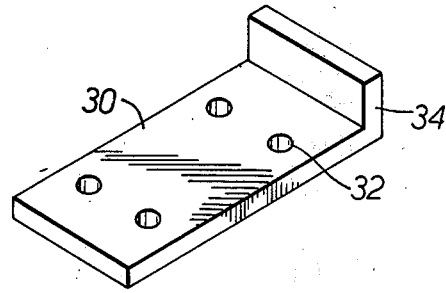
Fig.2.
Fig.3.
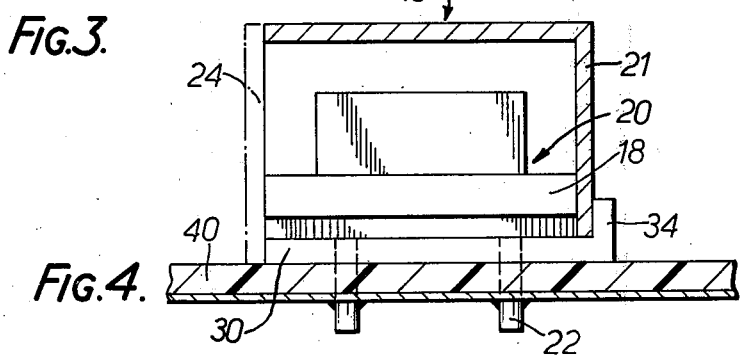
Fig.4.

COVER ASSEMBLIES FOR ELECTRICAL APPARATUS

The present invention relates to cover assemblies for electrical apparatus and particularly but not exclusively to a cover assembly for an electrical spring set such as is used in a telephone subscribers handset as the cradle switch spring set.

It is advantageous in telephone subsets for electrical spring set contacts to be provided with a cover. The cover should preferably be fairly permanent to avoid its unauthorised removal and to avoid dislodging during any vibration or shock caused to the subset.

The use of adhesives to retain the cover in position is not desirable due to possible contamination of the contacts and also due to the necessary curing time before the unit can be handled.

It is an object of the present invention to provide a cover assembly for electrical apparatus which enables the apparatus to be adjusted until just prior to assembly on a printed circuit board and also to provide a semipermanent cover which prevents unauthorised tampering with the apparatus during use.

Embodiments of the present invention will now be described by way of example with reference to the accompanying drawings in which:

FIG. 1 shows a cover assembly for electrical apparatus according to the present invention intended to cover an electrical device, FIG. 2 shows in a simplified form the electrical device to be covered, FIG. 3 shows a mounting pad for the device of FIG. 2 incorporating a locking device, and FIG. 4 shows in partial cross section the completed assembly.

Referring now to FIG. 1 the cover 10 is preferably made of clear plastics material and comprises an upper portion 12 which covers the springset and a lower portion 14. The portion 14 is provided with flanges 16 which in use co-operate with lugs 18 provided on the base of the electrical device 20 shown in FIG. 2.

The cover 10 is provided with a closed end as indicated at 21 and if it is required to close both ends of the electrical device the device can be provided with an upstanding plain end 24 shown in dotted lines.

FIG. 3 shows a mounting pad 30 which is provided with holes 32 for the passage of four terminal pins 22 of the device 20. A flange 34 is formed at one end of the pad 30.

In use the electrical device 20 is checked to ensure it is ready for assembly on to a printed circuit board 40 (FIG. 4). The cover 10 is slid on to the lugs 18 until the closed end 21 of the cover meets the end of the electrical device 20. The mounting pad 30 is slid upwardly over the pins 22 and the flange 34 abuts against the closed end 21 of the cover 10, thus preventing it from sliding off the lugs 18. The device 20, cover 10 and mounting pad 30 are then lowered on to the printed circuit board 40 until the terminal pins 22 protrude through the board. The pins 22 are then soldered to the board 40 in known manner. The cover 10 is thus retained in position and is not removable until the electrical device is removed from the board 40 by unsoldering the pins 22, and the pad 30 removed.

What we claim is:

1. A cover assembly covering an electrical apparatus in a permanently secure manner, said electrical apparatus being of the kind having projecting pins in engagement with holes formed in a mounting surface, said cover assembly comprising a cover member having flange means accepting said electrical apparatus to secure said electrical apparatus inside said cover member, said cover member having an end wall contacting said electrical apparatus, a mounting member comprising a pad having holes accepting said projecting pins of said electrical apparatus, said mounting member also comprising a projection secured to said pad, said projection engaging the outside surface of said end wall, whereby to prevent the removal of said cover from said electrical apparatus.

2. A cover assembly as claimed in claim 1 in which the flange means comprises two flanges, one arranged on each side of the cover member.

3. A cover assembly as claimed in claim 1 in which the cover member has a substantially U-shaped cross-section, each leg of the U-shape being provided adjacent its end with a groove.

4. A cover assembly as claimed in claim 3 in which the end wall also covers the end of each groove.

5. A cover assembly as claimed in claim 1 in which the cover assembly is provided with an end plate fixed to an end of said cover assembly remote from said end wall of said cover member, said end plate being of substantially the same dimensions as the end wall of the cover member.

* * * * *